United States Patent [19]

Mine et al.

[11] Patent Number: 5,370,904
[45] Date of Patent: Dec. 6, 1994

[54] METHOD FOR THE FORMATION OF SILICON OXIDE FILMS

[75] Inventors: Katsutoshi Mine; Takashi Nakamura; Motoshi Sasaki, all of Chiba, Japan

[73] Assignee: Dow Corning Toray Silicone Co., Ltd., Tokyo, Japan

[21] Appl. No.: 148,744

[22] Filed: Oct. 29, 1993

[30] Foreign Application Priority Data

Dec. 10, 1992 [JP] Japan .................. 4-352735

[51] Int. Cl.$^5$ .............................. B05D 5/12
[52] U.S. Cl. ......................... 427/126.2; 427/226; 427/377; 427/387; 427/397.7; 437/235; 437/238
[58] Field of Search .............. 427/226, 228, 377, 379, 427/387, 397.7, 126.2; 437/235, 238

[56] References Cited

U.S. PATENT DOCUMENTS

| | | | |
|---|---|---|---|
| 3,615,272 | 10/1971 | Collins et al. | 23/366 |
| 5,118,530 | 6/1992 | Hanneman et al. | 427/377 X |
| 5,145,723 | 9/1992 | Ballance et al. | 427/397.7 |

FOREIGN PATENT DOCUMENTS

| | | |
|---|---|---|
| 386969 | 9/1990 | European Pat. Off. . |
| 560485 | 9/1993 | European Pat. Off. . |
| 60-86017 | 5/1985 | Japan . |
| 3183675 | 5/1991 | Japan . |

OTHER PUBLICATIONS

European Materials Research Society Monographs, vol. 5, 1992, pp. 77–84, V. Belot et al., "Thermal decomposition of hydrosilsesquioxane gels under agron".

Fujitsu–Scientific & Technical Journal, vol. 28, No. 3, Aug. 1992, pp. 385–392, S. Fukuyama et al., "Polysiloxane As An Interlevel Dielectric For VLSI Fabrication".

Journal Of The Electrochemical Society, vol. 137, No. 10, Oct. 1990, pp. 3223–3229, A. Oikawa et al., "Polysilphenylenesiloxane Resin As An Interlevel Dielectric For VLSI Multilevel Interconnections".

*Primary Examiner*—Michael Lusignan
*Attorney, Agent, or Firm*—Roger E. Gobrogge

[57] ABSTRACT

Disclosed is a method for the formation of a thick silicon oxide film on the surface of a substrate. The method comprises forming a hydrogen silsesquioxane resin film on the surface of a substrate and converting the hydrogen silsesquioxane resin into silicon oxide ceramic by heating the resin film-bearing substrate in an inert gas atmosphere at 250° C. to 500° C. until the content of silicon-bonded hydrogen in the silicon oxide product has reached $\leq 80\%$ of the content of silicon-bonded hydrogen in the hydrogen silsesquioxane.

13 Claims, No Drawings

METHOD FOR THE FORMATION OF SILICON OXIDE FILMS

BACKGROUND OF THE INVENTION

The present invention relates to a method for the formation of a silicon oxide film on the surface of a substrate. More specifically, the present invention relates to a method for the formation of a thick silicon oxide film that is free of cracks and pinholes and that is insoluble in organic solvents.

The formation of a protective film on the surface of a substrate is a technique in general use for the protection of the surface of a substrate. In the particular case of the electric/electronic industries, there has been a very substantial increase in the complexity of semiconductor devices and in topographical variations on the surface of semiconductor devices in association with recent increases in the degree of integration and layer count of such devices. An interlevel dielectric layer may be formed on the surface of a semiconductor device in order to planarize the topographical variations on the surface of the device, while a passivation coating can be laid down on the surface of a semiconductor device in order to protect it from mechanical damage, chemical damage, damage due to static, ionic contaminants, non-ionic contaminants, radiation damage, and so forth.

Silicon oxide films are typically used for the interlevel dielectric layers and passivation coatings formed on semiconductor device surfaces. Chemical-vapor deposition (CVD) and spin-coating are examples of the methods used to form these silicon oxide films. In one such spin-coating method, a film of hydrogen silsesquioxane resin is formed on the surface of the substrate (e.g., the semiconductor device, etc. ), and the resin film-bearing substrate is then heated to 500° C. to 1,000° C. in an inert gas atmosphere in order to form a silicon oxide film (Japanese Patent Application Laid Open [Kokai or Unexamined] Number Hei 3-183675 [183,675/1991]).

However, the method proposed in Japanese Patent Application Laid Open Number Hei 3-183675 is not able to produce a silicon oxide film thicker than 0.6 micrometers (6,000 angstroms). As a result, this method cannot completely planarize the topographical variations encountered on the surfaces of semiconductor devices, i.e. , topographical variations or height differences in excess of 0.6 micrometers (6,000 angstroms). In addition, when the production of a thick silicon oxide film is attempted by this method, cracks and pinholes are produced in the silicon oxide film and the reliability of the semiconductor device is drastically reduced.

The inventors conducted extensive research into the cause of the inability of the method proposed in Japanese Patent Application Laid Open Number Hei 3-183675 to produce thick silicon oxide films. It was discovered that this inability is due to the excessively high-temperature heating (500° C. to 1,000° C.) that is used in order to give a 0% content of silicon-bonded hydrogen in the silicon oxide product. It was also discovered that the silicon oxide film could perform well as an interlevel dielectric layer or passivation coating on the surface of a semiconductor device when the Si-bonded hydrogen content in the silicon oxide film product did not exceed 80% of the Si-bonded hydrogen content in the starting hydrogen silsesquioxane resin. Accordingly, the present invention was achieved as a result of extensive research into a silicon oxide film formation method that would be capable of producing a crack-free and pinhole-free thick silicon oxide film that could function as an interlevel dielectric layer or passivation coating on tile surface of a semiconductor device and that would also be able to thoroughly planarize the topographical variations on the surfaces of semiconductor devices.

The present invention takes as its object the introduction of a method for the formation of an organic solvent-insoluble, crack-free and pinhole-free silicon oxide thick film by the formation of a hydrogen silsesquioxane resin film on the surface of a substrate and then heating this resin film-bearing substrate.

SUMMARY OF THE INVENTION

The present invention relates to a method for the formation of a silicon oxide film. The method is characterized by the formation of a hydrogen silsesquioxane resin film on the surface of a substrate and subsequent conversion of said hydrogen silsesquioxane resin into silicon oxide ceramic by heating the resin film-bearing substrate in an inert gas atmosphere at 250° C. to 500° C. (not including 500° C.) until the content of silicon-bonded hydrogen in the silicon oxide product has reached $\leq 80\%$ of the content of silicon-bonded hydrogen in the aforesaid hydrogen silsesquioxane resin.

The present invention also relates to a method for the formation of silicon oxide film on the surface of a semiconductor. The method is characterized by the formation of a hydrogen silsesquioxane resin film on the surface of a semiconductor device and subsequent conversion of said hydrogen silsesquioxane resin into silicon oxide ceramic by heating the resin film-bearing semiconductor device in an inert gas atmosphere at 250° C. to 500° C. (not including 500° C.) until the content of silicon-bonded hydrogen in the silicon oxide product has reached $\leq 80\%$ of the content of silicon-bonded hydrogen in the aforesaid hydrogen silsesquioxane resin.

The present invention further relates to a method for the formation of silicon oxide film which is characterized by the planarization of the topographical variations on the surface of a semiconductor device by the formation thereon of a hydrogen silsesquioxane resin film, and the subsequent conversion of said hydrogen silsesquioxane resin into silicon oxide ceramic by heating the resin film-bearing semiconductor device in an inert gas atmosphere at 250° C. to 500° C. (not including 500° C.) until the content of silicon-bonded hydrogen in the silicon oxide product has reached $\leq 80\%$ of the content of silicon-bonded hydrogen in the aforesaid hydrogen silsesquioxane resin.

DETAILED DESCRIPTION OF THE INVENTION

The method of the present invention relates to the formation of silicon oxide films which are thick, free of cracks and pinholes and insoluble in organic solvents. Generally, the method of the present invention involves forming a hydrogen silsesquioxane resin film on the surface of a substrate and heating the hydrogen silsesquioxane resin to convert it into a silicon oxide ceramic. The hydrogen silsesquioxane resin used by the present invention to coat the substrate surface is a compound with the following formula:

$$(HSiO_{3/2})_n$$

wherein n is an integer. Its terminal groups, molecular weight, and structure are not specifically restricted, although molecular weights of approximately 400 to 100,000 are preferred. Its physical properties, such as viscosity, softening point, etc., are also not specifically restricted. In addition, the con tent of silicon-bonded hydrogen in the hydrogen silsesquioxane resin used by the invention is not specifically restricted. This value will vary with the molecular weight and type of terminal groups, and in general the silicon-bonded hydrogen content is 1.5 to 2.5 weight % calculated on the hydrogen silsesquioxane resin.

The method for synthesis of the subject hydrogen silsesquioxane is also not specifically restricted. Methods for hydrogen silsesquioxane synthesis are specifically exemplified by the hydrolysis of trichlorosilane using the crystal water of benzenesulfonic acid or toluenesulfonic acid (U.S. Pat. No. 3,615,272) and by the hydrolysis of trichlorosilane in dilute solution using a small quantity of water (Japanese Patent Application Laid Open Number Sho 60-86017 [86,017/1985]).

The procedure used in the present invention to form the hydrogen silsesquioxane resin film on the surface of the substrate is not specifically restricted. This procedure is specifically exemplified by the following two methods: (1) preparation of an organic solvent solution of the hydrogen silsesquioxane resin, application of this solution by spin-coating, spraying, or immersion, then removal of the solvent to yield a film of the hydrogen silsesquioxane resin on the surface of the substrate; (2) heating a low-molecular-weight hydrogen silsesquioxane resin at reduced pressure in order to bring about vapor deposition of the resin on the surface of the substrate. The former method is preferred.

In the former method, there is no specific restriction on the organic solvent used to dissolve the hydrogen silsesquioxane resin. The structure of this organic solvent preferably does not contain active hydrogen. The organic solvent t under consideration is specifically exemplified by aromatic solvents such as toluene, xylene, and so forth; aliphatic solvents such as hexane, heptane, octane, and so forth; ketone solvents such as methyl ethyl ketone, methyl isobutyl ketone, and so forth; and ester solvents such as butyl acetate, isoamyl acetate, and so forth. Additional examples of this solvent are silicone solvents, for example, linear siloxanes such as 1,1,1,3,3,3-hexamethyldisiloxane, 1,1,3,3-tetramethyldisiloxane, and so forth; cyclic siloxanes such as 1,1,3,3,5,5,7,7-octamethyltetracyclosiloxane, 1,3,5,7-tetramethyltetracyclosiloxane, and so forth; and silanes such as tetramethylsilane, dimethyldiethylsilane, and so forth. Mixtures of two or more of these organic solvents can also be used.

No specific restrictions apply to tile substrates operable in the present invention for formation of the hydrogen silsesquioxane resin film. The substrate is specifically exemplified by glass substrates, ceramic substrates, metal substrates, and semiconductor devices, with semiconductor devices being particularly preferred. The surface of the semiconductor device may present topographical variations, in which event these topographical variations can be planarized by the silicon oxide film formation method of tile present invention.

The substrate bearing the hydrogen silsesquioxane resin film is subsequently heated in an inert gas atmosphere at 250° C. to 500° C. (excluding 500° C.) until the content of silicon-bonded hydrogen in tile produced silicon oxide becomes $\leqq 80\%$ of the content of silicon-bonded hydrogen in said hydrogen silsesquioxane resin.

The inert gas operable for the present invention is not specifically restricted, and it is specifically exemplified by nitrogen, argon, helium, and neon. Nitrogen is preferred for its low cost and ease of acquisition on an industrial basis.

The substrate carrying the hydrogen silsesquioxane resin film is heated at temperatures in the range of 250° C. to 500° C. (excluding 500° C.). The bases for this range are as follows: When the heating temperature is below 250° C., the hydrogen silsesquioxane resin is not thoroughly converted into ceramic silicon oxide and as a result remains soluble in organic solvent. The product in this case is therefore unfit for use as a passivation coating or interlevel dielectric layer. On the other hand, the formation of a crack- and pinhole-free silicon oxide thick film is no longer possible when the heating temperature is 500° C. or above. No specific restrictions apply to the heating time except that heating must be carried out for a period of time sufficient for the content of silicon-bonded hydrogen in the silicon oxide product to become $\leqq 80\%$ of the content of silicon-bonded hydrogen in the starting hydrogen silsesquioxane resin. When the content of silicon-bonded hydrogen in the produced silicon oxide exceeds 80% of the content of silicon-bonded hydrogen in the starting hydrogen silsesquioxane resin, the silicon oxide product remains soluble in organic solvent and is therefore not capable of functioning as a passivation coating or interlevel dielectric layer. Although the heating time cannot be rigidly stipulated because the required heating time varies as a function of the heating temperature, the following heating times are given as preferred examples: approximately 1 hour at 450° C., approximately 2 hours at 400° C., approximately 3 hours at 350° C., approximately 3 hours at 300° C., and approximately 4 hours at 250° C.

An infrared spectrophotometer can be used to measure the silicon-bonded hydrogen content in both tile hydrogen silsesquioxane resin film and silicon oxide film formed on the surface of the substrate. The point at which the silicon-bonded hydrogen content in the silicon oxide .film reaches $\leqq 80\%$ of the silicon-bonded hydrogen content in tile starting hydrogen silsesquioxane resin film is readily determined in the present invention using an infrared spectrophotometer from tile intensity ratio K'/K wherein K is tile intensity of the SiH peak (vicinity of 2250 cm$^{-1}$) relative to the SiOSi peak (vicinity of 1100 cm$^{-1}$) in the hydrogen silsesquioxane resin film and K' is the intensity of the SiH peak (vicinity of 2250 cm$^{-1}$) relative to the SiOSi peak (vicinity of 1100 cm$^{-1}$) in the silicon oxide that is produced.

The silicon oxide film formation method of the present invention can produce a thick (greater than 0.6 micrometers), crack-free, and pinhole-free silicon oxide film that is capable of functioning as a passivation coating or interlevel dielectric layer. For example, this method can produce crack- and pinhole-free silicon oxide films with thicknesses greater than 1.0 micrometers. Furthermore, the crosslink density in the silicon oxide film can be freely controlled or adjusted in the method of the present invention. This provides the additional effect of making possible relaxation of the internal stresses in the silicon oxide film that is produced. Moreover, because the method of the present invention produces a silicon oxide film by heating at temperatures of 250° C. to 500° C. (excluding 500° C.), it is useful for the formation of an interlevel dielectric layer or passivation coating on a semiconductor device surface because it avoids the melting-based deterioration of the aluminum that is used for semiconductor device interconnections.

The method of the present invention is useful for the formation of the interlevel dielectric layer in multilayer semiconductor devices because an organic resin layer, silicon oxide layer, and so forth, can additionally be formed on the surface of a substrate carrying the silicon oxide film formed by the method of the present invention.

The present invention is explained in greater detail below through working and comparison examples. The method described below was used to measure the value of the silicon-bonded hydrogen content in the silicon oxide film relative to the silicon-bonded hydrogen content in the hydrogen silsesquioxane resin film formed on the surface of the semiconductor device:

Using an infrared spectrophotometer, the intensity $I_{SiOSi}$ of the SiOSi peak (vicinity of 1100 cm$^{-1}$) and the intensity $I_{SiH}$ of the SiH peak (vicinity of 2250 cm$^{-1}$) were determined for the hydrogen silsesquioxane resin film formed on the surface of the semiconductor device, and their ratio K was calculated from $K = I_{SiH}/I_{SiOSi}$. The intensity $I'_{SiOSi}$ of the SiOSi peak (vicinity of 1100 cm$^{-1}$) and the intensity $I'_{SiH}$ of the SiH peak (vicinity of 2250 cm$^{-1}$) were also determined for the silicon oxide film subsequently formed on the surface of the semiconductor device, and their ratio K' was calculated from $K' = I'_{SiH}/I'_{SiOSi}$. The ratio K'/K was then calculated.

REFERENCE EXAMPLE 1

Hydrogen silsesquioxane resin was prepared by the method taught in Japanese Patent Publication Number Sho 47-31838 [31,838/1972] as follows: Toluenesulfonic acid monohydrate was prepared by dripping 6 moles toluene over a period of 1 hour into a mixture of 3.75 moles sulfuric acid and 2.25 moles fuming sulfuric acid at a mixture temperature of 45° C. to 60° C. and then aging for an additional 30 minutes at 45° C. Into this product was then dripped the mixture of 1 mole trichlorosilane and 6.6 moles toluene over a period of 5 hours at 30° C. followed by ageing for 30 minutes at 45° C. After cooling and layer separation, the toluenesulfonic acid layer (lower layer) was removed. In order to remove the acid present in the upper layer, it was washed with suitable quantities of sulfuric acid/water (50/50 weight ratio), then sulfuric acid/water (25/75 weight ratio), and finally water. The water was then completely eliminated by azeotropic drying for 1 hour to afford a toluene solution. Removal of the toluene front this toluene solution by reduced pressure (vacuum pump) at 60° C. gave hydrogen silsesquioxane resin A. This hydrogen silsesquioxane resin A had a number-average molecular weight ($M_n$) of 1,650, and the value of its weight-average molecular weight/number-average molecular weight ratio ($M_w/M_n$) was 19.4.

20 g hydrogen silsesquioxane resin A was then placed in a thoroughly dried 1 L roundbottom flask made of high-quality glass. 80 g thoroughly dried toluene was added and a thorough dissolution was effected. The entire system was maintained at 25° C., and the interior of the system was purged with nitrogen at a rate that did not remove solvent from the system. This purging was continued until the completion of fractionation. While vigorously stirring the solution, 50 g thoroughly dried acetonitrile was dripped in over a period of 1 hour. The precipitate was eliminated after quiescence for approximately 12 hours. After elimination of the precipitate, another 200 g thoroughly dried acetonitrile was dripped into the solution over a period of 4 hours. Collection of tile resulting precipitate and removal of the residual solvent therefrom by vacuum drying at ambient temperature yielded a hydrogen silsesquioxane resin B. The $M_n$ of this hydrogen silsesquioxane resin B was 11,400 and its $M_w/M_n$ was 2.88. The ionic and metal impurities were each $\leq 1$ ppm.

EXAMPLE 1

Hydrogen silsesquioxane resin B was dissolved in methyl isobutyl ketone (MIBK) to prepare a 30 weight % solution. This solution was spin-coated on a substrate for semiconductor device fabrication (height variation=1.0 micrometers) to give a hydrogen silsesquioxane resin film having a maximum thickness of 1.39 micrometers. After this film formation step, the semiconductor device substrate was held for 20 hours at 25° C. and then heated for 2 hours at 400° C., in each case in a pure nitrogen atmosphere. This was followed by gradual cooling in a pure nitrogen atmosphere to room temperature. Evaluation of the properties of the silicon oxide film formed on the semiconductor device substrate confirmed that the maximum thickness was 1.23 micrometers and the topographical variations of a semiconductor device surface were able to be planarized to uniformity and that there were no pinholes or cracks in the silicon oxide film. Based on tile results of infrared spectrophotometric analysis, the silicon-bonded hydrogen content in the silicon oxide film was 51% of the silicon-bonded hydrogen content in the hydrogen silsesquioxane resin film prior to heating. It was also confirmed that the silicon oxide film was insoluble in organic solvents such as MIBK and so forth.

EXAMPLE 2

Hydrogen silsesquioxane resin B was dissolved in MIBK to prepare a 30 weight % solution. This solution was spin-coated on a substrate for semiconductor device fabrication (height variation=0.75 micrometers) to give a hydrogen silsesquioxane resin film having a maximum thickness of 1.20 micrometers. After this film formation step, the semiconductor device substrate was held for 20 hours at 25° C. and then heated for 1 hour at 450° C., in each case in a pure nitrogen atmosphere. This was followed by gradual cooling in a pure nitrogen atmosphere to room temperature. Evaluation of the properties of the silicon oxide film formed on the semiconductor device substrate confirmed that the maximum thickness was 1.00 micrometers and the topographical variations of a semiconductor device surface were able to be planarized to uniformity and that there were no pinholes or cracks in the silicon oxide film. Based on the results of infrared spectrophotometric analysis, the silicon-bonded hydrogen content in the silicon oxide film was 28% of the silicon-bonded hydrogen content in the hydrogen silsesquioxane resin film prior to heating. It was also confirmed that this silicon oxide film was insoluble in organic solvents such as MIBK and so forth.

COMPARISON EXAMPLE 1

Hydrogen silsesquioxane resin B was dissolved in MIBK to prepare a 30 weight % solution. This solution was spin-coated on a substrate for semiconductor device fabrication (height variation=0.75 micrometers) to give a hydrogen silsesquioxane resin film having a maximum thickness of 1.20 micrometers. After this film formation step, the semiconductor device substrate was held for 20 hours at 25° C. and then heated for 1 hour at 450° C., in each case in an oxygen atmosphere. This was followed by gradual cooling in a nitrogen atmosphere to room temperature. While the maximum thickness of the silicon oxide film formed on the semiconductor device substrate was 0.82 micrometers, large numbers of cracks were produced in the surface of the silicon oxide film and the topographical variations of a semiconductor device surface were not able to be planarized to uniformity. Based on the results of infrared spectrophotometric analysis, the silicon-bonded hydrogen content in the silicon oxide film was 8% of the silicon-bonded hydrogen content in the hydrogen silsesquioxane resin film prior to heating.

EXAMPLE 3

Hydrogen silsesquioxane resin B was dissolved in MIBK to prepare a 30 weight % solution. This solution was spin-coated on a substrate for semiconductor device fabrication (height variation=0.75 micrometers) to give a hydrogen silsesquioxane resin film having a maximum thickness of 1.15 micrometers. After this film formation step, the semiconductor device substrate was held for 20 hours at 25° C. and then heated for 4 hours at 250° C., in each case in a pure nitrogen atmosphere. This was followed by gradual cooling in a pure nitrogen atmosphere to room temperature. Evaluation of the properties of the silicon oxide film formed on the semiconductor device substrate confirmed that the maximum thickness was 1.03 micrometers and the topographical variations of a semiconductor device surface were able to be planarized to uniformity and that there were no pinholes or cracks in the silicon oxide film. Based on the results of infrared spectrophotometric analysis, the silicon-bonded hydrogen content in the silicon oxide film was 80% of the silicon-bonded hydrogen content in the hydrogen silsesquioxane resin film prior to heating. It was also confirmed that this silicon oxide film was insoluble in organic solvents such as MIBK and so forth.

COMPARISON EXAMPLE 2

Hydrogen silsesquioxane resin B was dissolved in MIBK to prepare a 30 weight % solution. This solution was spin-coated on a substrate for semiconductor device fabrication (height variation=0.75 micrometers) to give a hydrogen silsesquioxane resin film having a maximum thickness of 1.15 micrometers. After this film formation step, the silicon substrate was held for 20 hours at 25° C. and then heated for 4 hours at 200° C., in each case in a pure nitrogen atmosphere. This was followed by gradual cooling in a pure nitrogen atmosphere to room temperature. When the properties of the silicon oxide film formed on the semiconductor device substrate were examined, it was found that this silicon oxide film was free of crack and pinholes but could be redissolved in toluene. Based on the results of infrared spectrophotometric analysis, the silicon-bonded hydrogen content in the silicon oxide film was 100% of the silicon-bonded hydrogen content in the hydrogen silsesquioxane resin film prior to heating, which confirmed the complete absence of ceramification.

COMPARISON EXAMPLE 3

Hydrogen silsesquioxane resin B was dissolved in MIBK to prepare a 30 weight % solution. This solution was spin-coated on a substrate for semiconductor device fabrication (height variation=1.0 micrometer) to give a hydrogen silsesquioxane resin film having a maximum thickness of 1.24 micrometers. After this film formation step, the semiconductor device substrate was held for 20 hours at 25° C. and then heated for 1 hour at 600° C., in each case in a pure nitrogen atmosphere. This was followed by gradual cooling in a pure nitrogen atmosphere to room temperature. It was found that large numbers of cracks had been produced in the silicon oxide film formed on the semiconductor device substrate. Based on the results of infrared spectrophotometric analysis, the silicon-bonded hydrogen content in the silicon oxide film was 0% of the silicon-bonded hydrogen content in the hydrogen silsesquioxane resin film prior to heating, which confirmed a complete ceramification.

That which is claimed is:

1. A method for the formation of a silicon oxide film comprising:
    forming a hydrogen silsesquioxane resin film on the surface of a substrate and
    converting the hydrogen silsesquioxane resin into silicon oxide ceramic by heating the resin film-bearing substrate in an inert gas atmosphere at 250° C. up to, but not including, 500° C. until the content of silicon-bonded hydrogen in the silicon oxide product has reached $\leq 80\%$ of the content of silicon-bonded hydrogen in the hydrogen silsesquioxane resin.

2. The method of claim 1 wherein the hydrogen silsesquioxane resin film was formed on the surface of the substrate by preparing an organic solvent solution of the hydrogen silsesquioxane resin, applying this solution by a method selected from the group consisting of spin-coating, spraying, and immersion, and removing the solvent.

3. The method of claim 2 wherein the solvent is selected from the group consisting of aromatic solvents, aliphatic solvents, ketone solvents, ester solvents, and silicone solvents.

4. The method of claim 1 wherein the substrate is selected from the group consisting of glass substrates, ceramic substrates, metal substrates, and semiconductor devices.

5. The method of claim 1 wherein the inert gas is selected from the group consisting of nitrogen, argon, helium, and neon.

6. The method of claim 1 wherein the resin-film bearing substrate is heated at a temperature of 300° C. for about 3 hours.

7. The method of claim 1 wherein the resin-film bearing substrate is heated at a temperature of 250° C. for about 4 hours.

8. The method of claim 1 wherein the resin-film bearing substrate is heated at a temperature between 250° C. and 450° C. for between 1 and 4 hours.

9. The method of claim 1 wherein the resin-film bearing substrate is heated at a temperature of 450° C. for about 1 hour.

10. The method of claim 1 wherein the resin-film bearing substrate is heated at a temperature of 400° C. for about 2 hours.

11. The method of claim 1 wherein the resin-film bearing substrate is heated at a temperature of 350° C. for about 3 hours.

12. A method for the formation of a silicon oxide film, wherein the method is characterized by the formation of a hydrogen silsesquioxane resin film on the surface of a semiconductor device and subsequent conversion of the hydrogen silsesquioxane resin into silicon oxide ceramic by heating the resin film-bearing semiconductor device in an inert gas atmosphere at 250° C. up to, but not including, 500° C. until the content of silicon-bonded hydrogen in the silicon oxide product has reached ≦80% of the content of silicon-bonded hydrogen in the hydrogen silsesquioxane resin.

13. A method for the formation of a silicon oxide film wherein the method is characterized by the planarization of the topographical variations on the surface of a semiconductor device by the formation thereon of a hydrogen silsesquioxane resin film, and subsequent conversion of said hydrogen silsesquioxane resin into silicon oxide ceramic by heating the resin film-bearing semiconductor device in all inert gas atmosphere at 250° C. up to, but not including, 500° C. until the content of silicon-bonded hydrogen in the silicon oxide product has reached ≦80% of the content of silicon-bonded hydrogen in the hydrogen silsesquioxane resin.

* * * * *

UNITED STATES PATENT AND TRADEMARK OFFICE
CERTIFICATE OF CORRECTION

PATENT NO. : 5,370,904
DATED : December 6, 1994
INVENTOR(S) : Katsutoshi Mine, Takashi Nakamura, and Motoshi Sasaki It is certified that error appears in the above-indentified patent and that said Letters Patent is hereby corrected as shown below:

At column 2, line 4 delete "tile" and insert therefore --the--.
At column 3, lines 55, 64, and 68 delete each occurrence of "tile" and insert therefore --the--.
At column 4, lines 39, 44, 46, and 47 delete each occurrence of "tile" and insert therefore --the--.
At column 6, lines 4 and 29 delete each occurrence of "tile" and insert therefore --the--.

Signed and Sealed this

Fourteenth Day of October, 1997

Attest:

BRUCE LEHMAN

*Attesting Officer*  Commissioner of Patents and Trademarks